United States Patent [19]

Caspell

[11] Patent Number: 4,631,518
[45] Date of Patent: Dec. 23, 1986

[54] DIGITAL-TO-ANALOG CONVERTER BIASING CONTROL CIRCUIT

[75] Inventor: George J. Caspell, Hillsboro, Oreg.

[73] Assignee: Tektronix, Inc., Beaverton, Oreg.

[21] Appl. No.: 653,617

[22] Filed: Sep. 24, 1984

[51] Int. Cl.[4] ............................................. H03K 13/02
[52] U.S. Cl. ...................... 340/347 DA; 340/347 M; 358/138; 364/178; 307/353; 328/151
[58] Field of Search ................. 340/347 DA, 347 CC, 340/347 M; 307/353; 358/138; 328/151

[56] References Cited

PUBLICATIONS

The Engineering Staff of Analog Devices, Inc., Analog-Digital Conversion Handbook, 6/1972, pp. I-55 to I-61.

Primary Examiner—T. J. Sloyan
Attorney, Agent, or Firm—George T. Noe

[57] ABSTRACT

A device for controlling the output voltage range of a digital-to-analog (D/A) converter of the type wherein the converter output voltage range is proportional to the magnitude of an applied bias current. The device comprises means to sample and store a selected converter output voltage, means to produce a variable current of magnitude proportional to the stored converter output voltage, and a source of constant current. The constant current and the variable current are summed and applied to the converter as the bias current. The converter output voltage range is dependent on the variable portion of the applied bias current which is in turn dependent on the stored, selected converter output voltage.

10 Claims, 4 Drawing Figures

DIGITAL-TO-ANALOG CONVERTER BIASING CONTROL CIRCUIT

BACKGROUND OF THE INVENTION

The present invention relates in general to digital-to-analog (D/A) converters and in particular to a device for controlling the output voltage range of a D/A converter of the type wherein the converter output voltage range is proportional to the magnitude of an applied bias current.

D/A converters convert digitally encoded signals to analog voltage signals of proportionate magnitude. Typically a digital logic circuit, generating digital input data and signals controlling the operation of a D/A converter, uses the converter to generate various output voltages for reference or control purposes.

The output voltage range of a D/A converter is typically a function of an applied bias signal (current or voltage), the D/A converter output voltage being proportional to the product of the magnitudes of the digital input and the applied bias signal. The resolution of a D/A converter within a range determined by the applied bias signal depends on the input bit-handling capability of the converter. For example a converter designed for a four-bit digital input can produce 16 different output voltage levels while an eight-bit converter can produce 256 different output voltages. Higher resolution converters are usually more complex and expensive than low resolution converters and require the use of more complex and expensive external control circuitry. In some applications it would be advantageous if external control circuitry capable of controlling, for instance, a four-bit data bus, could cause a four-bit D/A converter to produce a large number of different output voltages.

In the prior art, a larger number of output voltage levels has been obtained from a low resolution converter by taking advantage of the dependency of D/A converter range on the applied bias signal. If the bias signal of a first D/A converter is not constant but is dependent on the output of a second D/A converter, then the number of different output voltage levels which can be generated by the first D/A converter greatly increases. For instance, a four-bit D/A converter biased with the output of a second four-bit D/A converter would operate over 15 different output ranges, not counting the null range resulting from a zero bias current. Though some of the voltage levels in one range may overlap with voltage levels in another range, the total number of possible distinct output voltage levels obtainable is increased. However, use of second D/A converter is expensive.

SUMMARY OF THE INVENTION

The present invention according to a particular embodiment thereof comprises a D/A converter biasing control circuit including means to sample and store the converter output voltage, a variable bias current source, and a constant bias current source. The stored converter output voltage is selectively used to determine the current supplied by the variable current source as a part of the D/A converter bias.

In the preferred embodiment, the sample and store means comprises an amplifier, a capacitor and a transistor switch. The amplifier generates a voltage equal to the converter output voltage. The switch applies charging current to the capacitor on receipt of a sample control signal, and when the capacitor is charged, the control signal terminates, opening the switch to disconnect the capacitor from the charging circuit. The capacitor then retains the sampled converter output voltage.

The aforementioned variable current source produces a current of magnitude proportional to an applied reference voltage, wherein the aforementioned capacitor voltage is applied as such reference voltage. The variable amplifier output current is summed with the current from the constant current source and applied as a bias current to the D/A converter. In the preferred embodiment, the variable current source comprises an operational amplifier having a high input impedance to avoid discharge of the capacitor.

The variable portion of the converter bias current will then be proportional to the last converter output voltage sampled by the sample and store means. Providing the D/A converter is of a type wherein the converter output range is proportional to the applied bias current, then the converter output range will vary with the last sampled and stored converter output voltage. Therefore the converter output voltage range is controlled by generating and storing a selected converter output voltage and using the stored voltage as a reference to control the converter bias current.

Through appropriate selection of digital input data, and repeated sample and store operations, the converter output voltage range may be adjusted to provide any of a large number of discrete levels within the design limits of the implementing circuitry. With so many different output ranges available, even a low resolution D/A converter can be driven to produce a great many different voltages.

It should be noted that in a preferred embodiment the sample and store means should operate more quickly than the D/A converter to avoid instability. In an alternative embodiment, a pair of sample and store means are connected in cascade, the first sampling and storing the converter output while the second samples and stores the voltage held by the first such that the input to the second sample and store means is stable during its acquisition time.

It is therefore an object of the present invention to provide an improved D/A converter biasing control circuit for obtaining a broad dynamic output range and high resolution from a low cost, low resolution D/A converter.

It is a further object of the present invention to provide an improved D/A converter biasing control circuit permitting control of converter output voltage range by external digital control circuits through a small number of external control lines.

It is a still further object of the present invention to provide an improved D/A converter biasing control circuit which, when controlled in conjunction with the converter digital input, permits external control circuits to enable a low resolution D/A converter to produce a large number of distinct output voltage levels.

The subject matter of the present invention is particularly pointed out and distinctly claimed in the concluding portion of this specification. The invention, however, both as to organization and method of operation, together with further advantages and objects thereof, may best be understood by reference to the following description taken in conjunction with the accompanying drawings wherein like reference characters refer to like elements.

DETAILED DESCRIPTION

Figure 1:
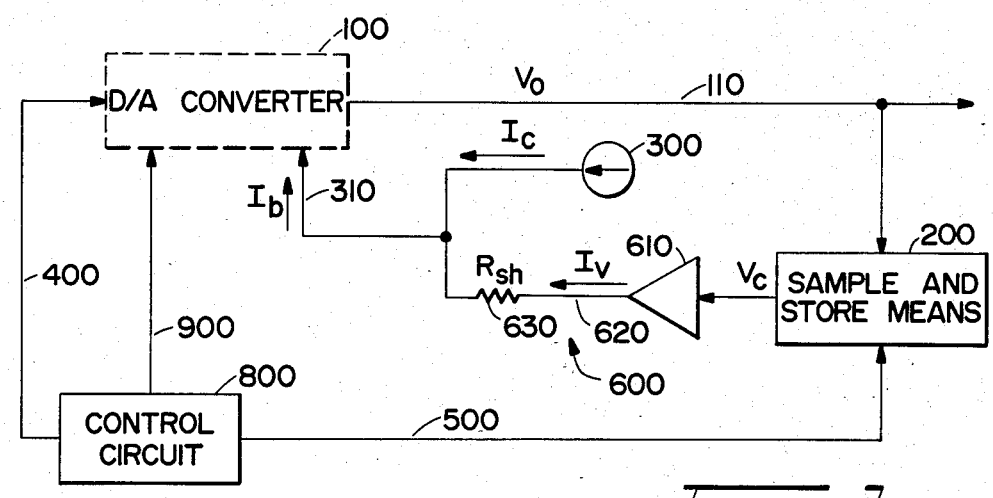
FIG. 1 is a combination block and schematic diagram of the D/A converter biasing control circuit according to a preferred embodiment of the present invention.

Referring to the drawings and in particular to FIG. 1, a digital-to-analog (D/A) converter biasing control circuit according to the present invention comprises sample and store means 200, constant current source 300, and variable current source 600. D/A converter 100 converts an N-bit digitally encoded signal on data bus 400 from digital input control circuit 800 to an analog output voltage signal $V_o$ on converter output line 110. The conversion takes place each time control circuit 800 generates a conversion control signal on converter control line 900. Converter output voltage $V_o$ is a function of the data applied on bus 400 and a function of converter bias current $I_b$ applied on bias input line 310. Specifically, in the preferred embodiment, $$V_o = A \times k \times I_b \qquad [1]$$

where "A" is a constant of proportionality dependent on the internal design of the converter and "k" is the magnitude of the digital data applied on converter data bus 400. The range of output voltage obtainable is thus directly proportional to the applied bias current $I_b$ while the actual magnitude of $V_o$ within a given output range is dependent on the data applied to data bus 400.

Sample and store means 200 is coupled to sample and hold the converter output voltage $V_o$ on receipt of a digital sample control signal via sample control line 500 from input circuit 800. Sample and store means 200 then provides sample voltage $V_c$ until receipt of a subsequent sample control signal on line 500 which replaces the stored voltage with a later converter output voltage. Variable current source 600 produces a current, $I_v$, of magnitude proportional to the applied reference voltage $V_c$ stored in sample and hold means 200 and this current $I_v$ is summed with current $I_c$ from constant current source 300 before application as bias current $I_b$ to D/A converter 310. In the preferred embodiment, variable current source 600 comprises amplifier 610 and resistor 630.

The variable portion $I_v$ of converter bias current $I_b$ is proportional to the last converter 100 output voltage $V_o$ stored by sample and store means 200. Since the D/A converter is of a type wherein the converter output range is proportional to the applied bias current, then the converter output range will be determined by the last sampled and stored converter output voltage. The converter output voltage range may thus be adjusted by generating and storing a selected converter output voltage $V_o$ and using the resulting stored voltage as a reference to control converter bias current $I_b$.

The smallest bias current, $I_b$, yielding the narrowest converter output voltage $V_o$ range, is obtained by zeroing the digital input data on bus 400 from control circuit 800 and signaling sample and store means 200 through control line 500 to store the resulting zero voltage output, thereby setting $V_c$ to zero. With $V_c$ set to zero, the variable portion $I_v$ of converter bias current $I_b$ goes to zero, minimizing the converter 100 output voltage range.

A larger bias current $I_b$, yielding a greater converter 100 output voltage range, can be obtained by applying selected, non-zero digital data to bus 400 from control circuit 800 to converter 100 and signaling converter 100 through control line 900 to produce the proportional non-zero converter output voltage $V_o$. Sample and store means 200 is then signaled through control line 500 to increase the stored voltage $V_c$ to equal the non-zero output voltage $V_o$. Variable current source 600 produces a proportional, non-zero variable bias current $I_v$, increasing the bias current $I_b$ applied to converter 100. Constant current source 300 is necessary to insure that at least a small amount of converter bias current $I_b$ is available to permit a non-zero converter output voltage when $I_v$ is zero.

A higher output voltage range permits converter 100 to generate a yet higher output voltage $V_o$, which may in turn be sampled, stored and used to further increase the bias current and converter range. Through appropriate selection of digital input data on bus 400, and repeated sample and store operations, the converter 100 output voltage range may be adjusted to substantially any number of discrete levels within the design limits of the D/A converter. I.e. the process can be repeated several times to alter the "full scale" range of the device to the desired level and thus the resolution of the D/A converter is greatly increased.

Figure 2:
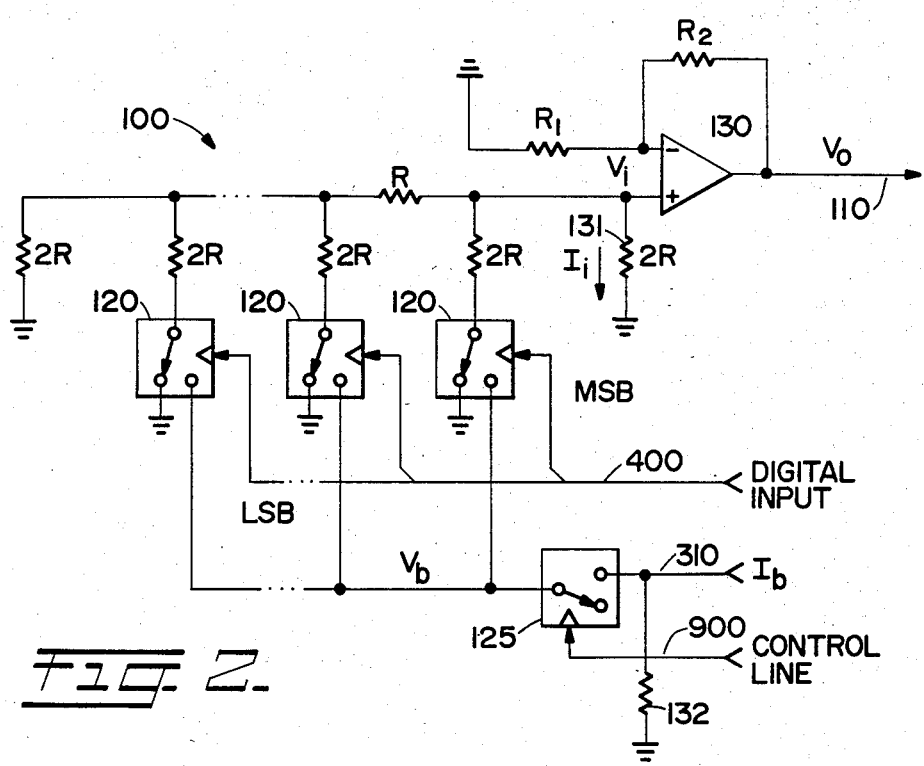
FIG. 2 is a combination block and schematic diagram of a typical D/A converter, depicted as a block in FIG. 1, which may be used in conjunction with the present invention.

FIG. 2 depicts a typical D/A converter suitable for use in conjunction with the present invention and illustrates how the range of a D/A converter is dependent on applied bias current $I_b$. This converter arrangement is well known in the art and is discussed only briefly herein. Converter output $V_o$, generated by operational amplifier 130, is proportional to amplifier input voltage $V_i$ which is in turn proportional to current $I_i$, while current $I_i$ is proportional to the sum of the currents passing through switches 120. Switches 120 selectively close in response to data on bus 400, the most significant data bit closing the switch 120 closest to amplifier 130 and the least significant data bit closing the switch 120 most distant from amplifier 130. Resistors of value R and 2R, as shown, form a network such that the current $I_i$ supplied through switches 120 to resistor 131 is proportional to the data on bus 400, as well as being proportional to the magnitude of bias voltage $V_b$. If the impedance of resistor 132 is low compared to the net parallel impedance to ground regardless of the positions of switches 120, then bias voltage $V_b$ is essentially dependent only on applied bias current $I_b$ and independent of the position of any switch 120. Converter output voltage $V_o$ is therefore proportional to the product of $I_b$ and the magnitude (k) of the data on bus 400 with a constant of proportionality dependent on the selected values of all resistors shown in FIG. 2. Thus the output voltage $V_o$ of A/D converter 100 depicted in FIG. 2 generally conforms to the equation [1] above.

Figure 3:
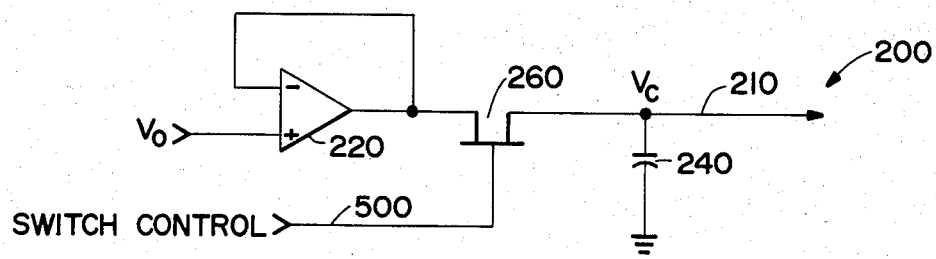
FIG. 3 is a schematic diagram of a typical sample and store circuit, depicted as a block in FIG. 1, which may be used in conjunction with the present invention.

A typical implementation of sample and store means 200 of FIG. 1 is depicted in FIG. 3. In FIG. 3 sample and store means 200 comprises operational amplifier 220, transistor 260 and capacitor 240. Converter output voltage $V_o$ is applied to the non-inverting input of operational amplifier 220, while the output of amplifier 220 is fed back into the amplifier inverting input. When sample control line 500 is driven to a high state by a pulse from control circuit 800, transistor 260 turns on, connecting the output of amplifier 220 to capacitor 240. The pulse stays high long enough to insure that capacitor voltage $V_c$ adjusts to $V_o$. Once the pulse on control line 500 ends, transistor 260 turns off, disconnecting capacitor 240 from operational amplifier 220. Capacitor 240 then retains stored voltage $V_c$ until control circuit 800 generates a subsequent pulse on sample control line 500 to replace the stored voltage with the latest converter output voltage $V_o$.

Figure 4:
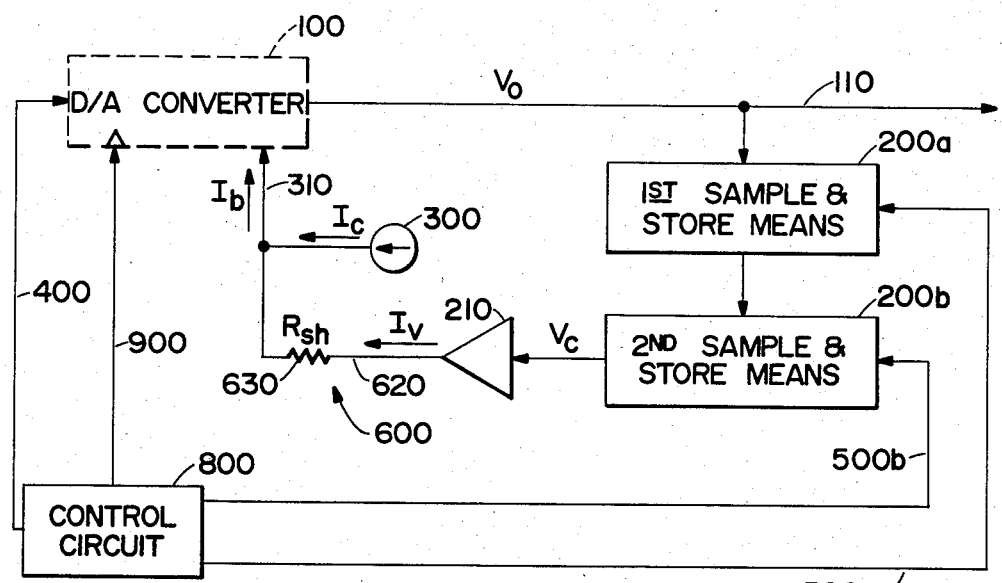
FIG. 4 is a combination block and schematic diagram according to an alternative embodiment of the present invention.

In the preferred embodiment of the present invention as depicted in FIG. 1, sample and store means 200 should operate more quickly than D/A converter 100 to avoid instability. Specifically, sampling should end before a change in stored voltage $V_c$ can result in a change in converter output voltage $V_o$ thereby causing an unwanted second change in stored voltage $V_c$. In an alternative embodiment, as depicted in FIG. 4, a pair of sample and store means are connected with first sample and store means 200a sampling and storing converter output $V_o$ and the second sample and store means 200b sampling and storing the voltage stored by the first. The voltage $V_c$ stored by the second sample and store means 200b is then used as a reference for variable current source 600. Control circuit 800 initially causes first sample and store means 200a to store a selected converter output voltage $V_o$ by applying a pulse to sample control line 500a. When sampling by sample and store means 200a is complete, control circuit 800 causes second sample and store means 200b to sample and store the voltage stored by first sample and store means 200a. The alternate embodiment of FIG. 2 thus allows use of comparatively slower sample and store means or a comparatively faster D/A converter. The input to sample and store means 200b is stable during its acquisition time.

Thus the present invention allows external circuits to control a large number of distinct output voltage levels from a low resolution D/A converter. A wide dynamic range is achieved through a successive or iterative process that adjusts the output levels available from the D.A.C.

While a preferred and an alternate embodiment of the present invention have been described, it will be apparent to those skilled in the art that many other changes and modifications may be made without departing from the invention in its broader aspects. The appended claims are therefore intended to cover all such changes and modifications as fall within the true spirit and scope of the present invention.

I claim:

1. The method of operating a device for controlling the output voltage range of a digital-to-analog converter including means for sampling and storing an output voltage of the digital-to-analog converter and means to bias the voltage range of the digital-to-analog converter in accordance with the stored value, said method comprising:

storing said output voltage in said sampling and storing means, biasing the voltage range of the digital-to-analog converter in accordance with a controlled current proportion to the stored value in combination with a predetermined constant current to provide a new output voltage, and successively sampling and storing a new output voltage value and using the same to bias said voltage range until a desired voltage range is achieved.

2. A device for controlling the output voltage range of a digital-to-analog converter of the type wherein the output voltage range is proportional to the magnitude of an applied bias current, the device comprising:

a source of a digital input signal of selected magnitude coupled to produce a selected converter output voltage, means to sample and store the selected converter output voltage, means to produce a control current proportional to the stored voltage, and a source of constant current, summed with the control current to form the applied bias current, the converter output voltage range thereby varying with the selected stored voltage.

3. A device according to claim 2 wherein the sample and store means comprises:

a capacitor for storing a voltage, and means to charge the capacitor to the converter output voltage, capacitor charging beginning upon converter generation of the selected output voltage and ending before the converter output voltage responds to the resultant change in the applied bias current.

4. A device according to claim 3 wherein the charging means comprises:

a source of a switch control signal, and switching means connecting the converter output across the capacitor when activated by the switch control signal, the switch control signal being of sufficient duration to permit the stored capacitor voltage to adjust to the selected converter output voltage, the control signal beginning upon converter generation of the selected output voltage and ending before the converter output voltage responds to any resultant change in the applied bias current.

5. A device according to claim 3 wherein the charging means comprises:

a source of switch control signal, an amplifier having an input coupled to the converter output and having an output equal to its input, and switching means connecting the amplifier output across the capacitor when activated by the switch control signal, the switch control signal being of sufficient duration to permit the stored capacitor voltage to adjust to the selected converter output voltage, the control signal beginning upon converter generation of the selected output voltage and ending before the converter output voltage responds to any resultant change in the applied bias current.

6. A device for controlling the output voltage range of a digital-to-analog converter of the type wherein the output voltage range is proportional to the magnitude of an applied bias current, the device comprising:

a source of digital input signal of selected magnitude coupled to produce a selected converter output voltage, first means to sample and store the selected converter output voltage, second means to sample and store the stored voltage of the first means, means to produce a control current proportional to the voltage stored by the second sample and store means, and a source of constant current, summed with the control current, to form the applied bias current, the converter output voltage range thereby varying with the selected stored voltage.

7. A device according to claim 6 wherein the first sample and store means comprises:

a capacitor for storing a voltage, and means to charge the capacitor to the selected converter output voltage, capacitor charging beginning upon converter generation of the selected output voltage and ending before the second sample and store means samples and stores the selected converter output voltage stored by the first sample and store means.

8. A device according to claim 7 wherein the charging means comprises:

a source of a switch control signal, and switching means connecting the converter output across the capacitor when activated by the switch control signal, the switch control signal being of sufficient duration to permit the stored capacitor voltage to adjust to the selected converter output voltage, the control signal beginning after converter generation of the selected output voltage and ending before the second sample and store means samples and stores the selected converter output voltage stored by the first sample and store means.

9. A device according to claim 7 wherein the charging means comprises:

a source of a switch control signal, an amplifier having an input coupled to the converter output and having an output equal to its input, and switching means connecting the amplifier output across the capacitor when activated by the switch control signal, the switch control signal being of sufficient duration to permit the stored capacitor voltage to adjust to the selected converter output voltage, the control signal beginning after converter generation of the selected output voltage and ending before the second sample and store means samples and stores the selected converter output voltage stored by the first sample and store means.

10. A device for controlling the output voltage range of a digital-to-analog converter of the type wherein the output voltage range is proportional to the magnitude of an applied bias current, the device comprising:

a source of digital input signal of selected magnitude coupled to produce a selected converter output voltage, a first amplifier having the converter output voltage as an input and generating a proportional output voltage, a first capacitor for storing a voltage, a source of first and second switch control signals, a first switching means connecting the first amplifier output across the first capacitor when activated by the first switch control signal, the first switch control signal being of sufficient duration to permit the first capacitor voltage to adjust to the first amplifier output voltage, a second amplifier having the first capacitor voltage as an input and generating a proportional output voltage, a second capacitor for storing a voltage, a second switching means connecting the second amplifier output across the first capacitor when activated by the second switch control signal, the second switch control signal being of sufficient duration to permit the second capacitor voltage to adjust to the first amplifier output voltage, a source of constant current, and a third amplifier, having the second capacitor voltage as an input and having a proportional output resistively coupled to the current source to form the applied bias current, the converter output voltage range thereby varying with a selected output voltage.

* * * * *